US012782401B2

(12) United States Patent
Yamasaki et al.

(10) Patent No.: US 12,782,401 B2
(45) Date of Patent: Nov. 3, 2026

(54) AGGREGATOR SYSTEM

(71) Applicant: Hitachi, Ltd., Tokyo (JP)

(72) Inventors: Tomoya Yamasaki, Tokyo (JP); Noriyuki Takeshita, Tokyo (JP); Hiroshi Yunoue, Tokyo (JP); Shinpei Ohyama, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 398 days.

(21) Appl. No.: 18/568,033

(22) PCT Filed: Jun. 9, 2022

(86) PCT No.: PCT/JP2022/023274

§ 371 (c)(1),
(2) Date: Dec. 7, 2023

(87) PCT Pub. No.: WO2022/260127

PCT Pub. Date: Dec. 15, 2022

(65) Prior Publication Data

US 2024/0280617 A1 Aug. 22, 2024

(30) Foreign Application Priority Data

Jun. 9, 2021 (JP) ................................ 2021-096577

(51) Int. Cl.
*G01R 21/133* (2006.01)
*G06Q 50/06* (2012.01)
*H02J 3/12* (2006.01)

(52) U.S. Cl.
CPC ........... *G01R 21/133* (2013.01); *G06Q 50/06* (2013.01); *H02J 3/12* (2013.01)

(58) Field of Classification Search
CPC ......... G01R 21/133; G06Q 50/06; H02J 3/12; H02J 3/14
(Continued)

(56) References Cited

U.S. PATENT DOCUMENTS 8,260,468 B2 * 9/2012 Ippolito ........... G06Q 10/06315 700/297
8,762,097 B2 * 6/2014 Millet ..................... G06F 1/206 374/170
(Continued)

FOREIGN PATENT DOCUMENTS

JP 2020-191766 A 11/2020
JP 6779177 B2 11/2020
WO WO 2016/113723 A1 7/2016

OTHER PUBLICATIONS

International Search Report (PCT/ISA/210) issued in PCT Application No. PCT/JP2022/023274 dated Sep. 6, 2022 with English translation (4 pages).
(Continued)

*Primary Examiner* — Aditya S Bhat
(74) *Attorney, Agent, or Firm* — Crowell & Moring LLP

(57) ABSTRACT

An aggregator system outputting a control instruction relating to electric power to a consumer consuming electric power, in accordance with a variation of a power generation amount of a power supply company, the aggregator system predicting adjustment power that is an adjustable amount of received power according to each of facilities of the consumer and outputting a control instruction for adjusting received power to each of the facilities on the basis of the predicted adjustment power of each of the facilities and a DR instruction that is a demand/supply adjustment instruction for the electric power from the power supply company.

7 Claims, 12 Drawing Sheets

(58) Field of Classification Search
USPC ........................................................... 702/57
See application file for complete search history.

(56) References Cited

U.S. PATENT DOCUMENTS

| | | | | |
|---|---|---|---|---|
| 9,818,073 | B2 * | 11/2017 | Koch ................. | G06Q 10/0631 |
| 9,976,792 | B2 * | 5/2018 | Besore .................... | F25D 29/00 |
| 2018/0025423 | A1 | 1/2018 | Utsumi et al. | |

OTHER PUBLICATIONS

Japanese-language Written Opinion (PCT/ISA/237) issued in PCT Application No. PCT/JP2022/023274 dated Sep. 6, 2022 with English translation (7 pages).

* cited by examiner

AGGREGATOR SYSTEM

CROSS REFERENCE TO RELATED APPLICATIONS

This application is a 371 of International Application No. PCT/JP2022/023274, filed Jun. 9, 2022, which claims priority to Japanese Patent Application No. 2021-096577, filed Jun. 9, 2021, the disclosures of all of which are expressly incorporated by reference herein.

TECHNICAL FIELD

The present invention relates to an aggregator system.

BACKGROUND ART

In received power adjustment performed in a power transmission/distribution network, a power demand/supply adjustment instruction, called a demand response (DR), for causing a consumer consuming electric power to temporarily control received electric power (purchased electric power), in accordance with variations of an amount of generated power of a power supply company side, is known. In addition, a company called an aggregator that mediates between a power supply company and a plurality of consumers and formulates and adjusts a power demand/supply plan using this DR instruction is known.

When a request (a large-scale DR request) for increasing or decreasing an amount of electric power is received from a power supply company, the aggregator divides the amount into smaller amounts and requests a plurality of consumers to perform power adjustment (a small-amount DR request). In accordance with an increase/decrease result (a small-amount DR result) of an amount of electric power of each consumer, an incentive (rebate) such as power charge reduction or the like is given from a power supply company to each consumer. In addition, in accordance with a total of success ratios of DRs of consumers (a small-amount DR result/a small-amount DR request), a predetermined incentive is paid from a power supply company to an aggregator. Here, for a party unable to respond to a request of a DR instruction, payment of a penalty is imposed on the aggregator (a deviation between a power supply planned value and a result value is compensated for), and thus, in order to avoid this, conventionally, for example, load control of decreasing an amount of power consumption by a device has been performed in power demand/supply adjustment.

However, the load control reduces comfort of consumers, and thus, in place thereof, for example, a method of performing power demand/supply adjustment by installing a storage battery at a consumer and decreasing received power in accordance with discharge of the storage battery and the like have been reviewed. Regarding this, for example, for the purpose of generating a DR plan reducing a total power cost in consideration of other events including a DR, as a background technology of the present invention, the following PTL 1 is known.

In PTL 1, a structure is disclosed in which an aggregator managing a plurality of bases performs power management of a storage battery and loads installed at a consumer by collecting a load control cost equation, in which comfortability is also reflected, in accordance with a small-amount demand/response request amount distributed from each base to a consumer and calculating and distributing a DR request amount on the basis of this load control cost equation has been disclosed.

CITATION LIST

Patent Literature

[PTL 1] U.S. Pat. No. 6,779,177

SUMMARY OF INVENTION

Technical Problem

In recent years, in order to meet greater customer demand, an aggregator has been required to improve a response capability for a DR request from a power supply company. An object of the present invention is to provide an aggregator system of which a response capability for a DR request is improved.

Solution to Problem

The present invention provides an aggregator system outputting a control instruction relating to electric power to a consumer consuming electric power, in accordance with a variation of a power generation amount of a power supply company, the aggregator system predicting an adjustment power that is an adjustable amount of received power according to each of facilities of the consumer and outputting a control instruction for adjusting a received power to each of the facilities on the basis of the predicted adjustment power of each of the facilities and a DR instruction that is a demand/supply adjustment instruction for electric power from the power supply company.

Advantageous Effects of Invention

According to the present invention, an aggregator system of which a response capability for a DR request is improved can be provided.

DESCRIPTION OF EMBODIMENTS

Figures 1A, 1B:
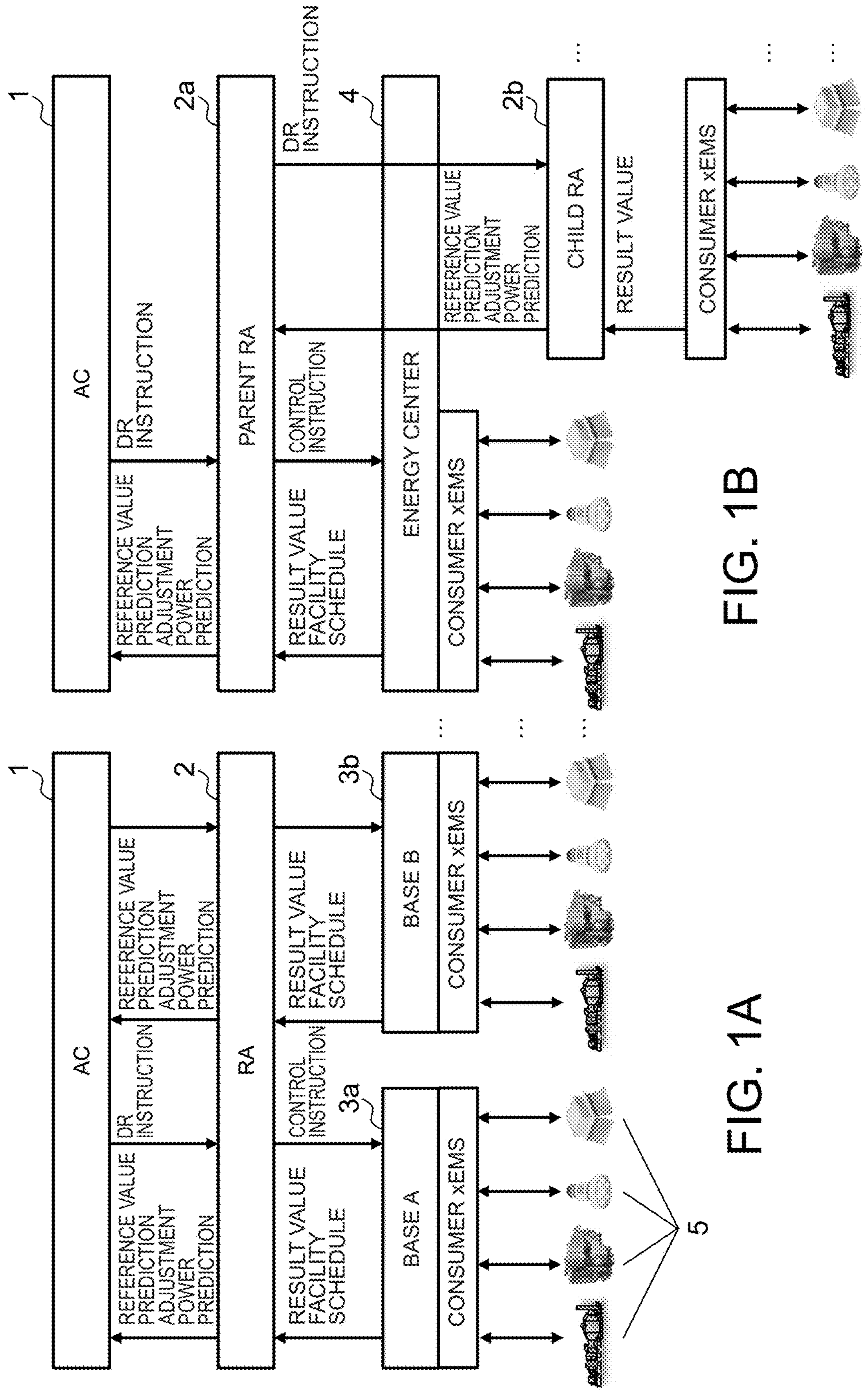
FIGS. 1A and 1B are overviews of an aggregator system according to an embodiment of the present invention.

Hereinafter, an embodiment of the present invention will be described. The following descriptions and drawings are examples for describing the present invention, and, for clarification of the descriptions, omissions and simplifications are appropriately performed. The present invention can be performed in various forms. Unless described as being particularly limited, a single constituent element or a plurality of constituent elements may be provided.

There are cases in which a position, a size, a shape, a range, and the like of each constituent element illustrated in the drawings do not represent an actual position, an actual size, an actual shape, an actual range, and the like for easy understanding of the invention. For this reason, the present invention is not necessarily limited to positions, sizes, shapes, ranges, and the like disclosed in the drawings.

One Embodiment of Present Invention and Entire Configuration

FIG. 1 is an overview of an aggregator system according to an embodiment of the present invention.

In an electric power market, roles of each company and a system in a Virtual power plant (VPP) including an aggregator company will be described on the basis of FIG. 1(*a*). FIG. 1(*a*) is an example of an aggregator system of a multiple-base type, and a maximum number of bases that can be managed is 20 bases.

First, a transmission system operator (TSO) that is a general power transmission and distribution company or an electric power retail company (electric power company) performs a direct power transaction with a plurality of aggregation coordinators (AC1) for securing a stable power source accompanying a reduction of a nuclear power generation ratio and an increase in a renewable energy power source when electric power is distributed to consumers of electric power. The TSO (a higher rank of the AC1; not illustrated) determines a contract volume of electric power supplied from the AC1 from adjustment power of each time and a delivery unit price for a bid from the AC1. For example, a method of determining that adjustment power of 3000 kw is supplied from the AC1 at 10 Yen/kw between a.m. 9:00 to 12:00 can be used. In addition, adjustment power represents a difference of a power increase/decrease value used for responding to a DR instruction from a planned value of power reception that is an original reference, that is, an adjustable amount used for demand/supply adjustment of electric power. In addition, a consumer is a company that receives and uses supply of power and mainly represents a factory, a building facility, or the like.

Each RA2 (resource aggregator) contracted with the AC1 clusters resources of a plurality of bases (consumers). In other words, the RA2 receives adjustment power and a reference value of predicted received electric power of each time frame, result data required for predicting adjustment power, a facility operating schedule, and the like from a consumer, predicts a reference value and adjustment power of each consumer, and notifies the AC1 of them. The RA2 drafts a facility plan for responding to a DR instruction from the AC1 to be described below on the basis of the reference value and the adjustment power of this received electric power and, on the basis of this, outputs a control instruction to a facility monitoring control system of each base.

The AC1 collects the reference value and the adjustment force of the received powers that have been notified and makes a bid to the TSO. In a case in which an amount of electric power is contracted in this bid, the AC1 distributes the contract amount (in units of kw) to RA2 thereunder. RA2 directly makes a VPP service contract with consumers 3*a* and 3*b* of a lower rank, thereby performing resource control of facilities 5 of the consumers 3*a* and 3*b*.

A flow in a case in which a DR instruction is notified from TSO to the AC1 will be described. In a case in which a request for demand/supply adjustment (a notification of a DR instruction) comes from TSO, AC1 notifies the DR instruction to RA2. In a case in which a DR instruction is notified from AC1, RA2 outputs a control instruction to a facility monitoring control system (xEMS: Energy Management System) of the consumers 3*a* and 3*b*. In addition, xEMS, for example, includes a Building and Energy Management System (BEMS), a Factory and Energy Management System (FEMS), a Distributed Control System (DCS), and the like.

xEMS receives a control instruction from RA2 and performs feedback control (resource control) for each of managed facilities using real-time result data such that the control instruction value is satisfied. In addition, a company having xEMS is assumed to have its own electric power resources or have an adjustment width of used electric power.

FIG. 1(*b*) is an example of an aggregator system on the premise of a local server model, and RA2 is divided into a parent RA2*a* and a child RA2*b*. The parent-child type RA2 is preferred for an aggregator system that can be customized to each consumer and is preferred also for an aggregator system of the present invention. In the parent-child type RA2, RA2*a* (parent RA) of the higher rank receives a reference value prediction and an adjustment power prediction from the child RA2*b* (in addition, the child RA2*b* complies with the reference value prediction and the adjustment power prediction that have been calculated by the child RA2*a*) and drafts a facility plan for responding to a DR instruction from AC1 based on this.

The aggregator system illustrated in FIG. 1(*b*) is appropriate to any one of a case in which each facility 5 of a consumer is directly managed by the parent RA2*a* or a case in which each facility 5 of the consumer is not directly managed by the parent RA2*a*. In addition, the aggregator system may be applied as a child aggregator system in which there are first consumers (parent RA2*a*) for which adjustment power is managed in units of facilities 5 and second consumers (child RA2*b*) for which adjustment power is managed in units of consumers by the aggregator system, or adjustment power is managed in units of a plurality of consumers.

In the aggregator system illustrated in FIG. 1(*b*), for each facility 5 that can be directly managed, when a DR instruction is notified from AC1, the parent RA2*a* outputs a control instruction to an energy center 4, thereby being able to control each facility 5 from the energy center 4 through the xEMS. On the other hand, in a case in which an electric power application from a single consumer is received by the AC1 or the like, when a DR instruction is notified from the AC1 to each facility 5 that cannot be directly managed, the parent RA2*a* directly notifies a DR instruction to a child RA2*b* managing each facility 5 through the xEMS and causes the child RA2*b* to take a role of DR distribution. In addition, the energy center 4 includes a main device such as a freezer or the like having a large power usage amount, a CGS, a power receiving and transforming facility, a central monitoring control apparatus, and a private power generation facility.

Figure 2:
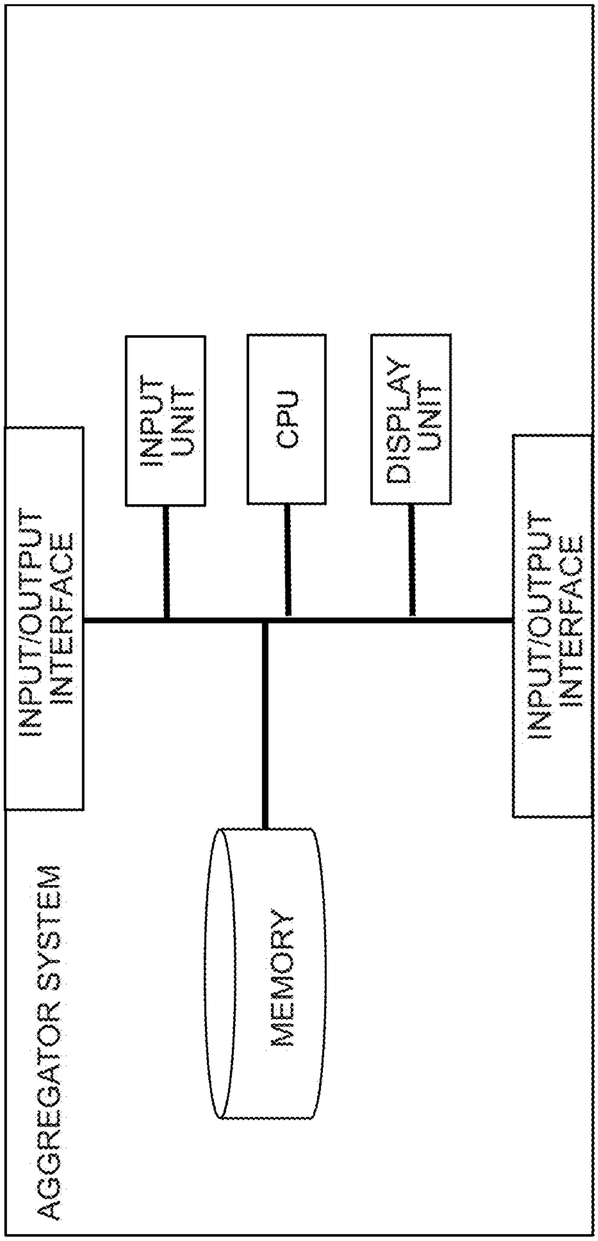
FIG. 2 is a hardware configuration example of an AC and an RA of an aggregator system.

FIG. 2 is a hardware configuration example of an AC1 and an RA2 of the aggregator system illustrated in FIG. 1. In the aggregator system, both the AC1 and RA2 can be realized using a computer according to the hardware configuration illustrated in FIG. 2. In the case of a parent-child type RA2 of the aggregator system illustrated in FIG. 1(*b*), also for both a parent RA2*a* and a child RA2*b*, the computer of the configuration as in FIG. 2 can be employed.

The AC1 and RA2 include a CPU, a memory, an input unit, a display unit, and an input/output interface. Such devices are connected through a system bus.

The memory, for example, is configured using volatile and non-volatile memories (storage media) including memories such as a RAM and a ROM and a storage device such as a hard disk. In the memory, a program causing a computer to function as the AC1 and the RA2 is stored. In addition, by reading a storage medium such as a CD-ROM, a DVD, or the like in which this program is stored, the computer may be caused to function as the AC1 and the RA2. Furthermore, in the case of the RA2, a database in which response results for DR instructions from the AC1 are recorded may be configured in the memory.

A plurality of functional units are built into the CPU in accordance with execution of programs stored in a memory and storage media such as a CD-ROM, a DVD, and the like. For example, the functional units are a functional unit collecting information of consumers, an arithmetic operation unit, a functional unit for adjusting a DR request amount, and a functional unit outputting a DR request amount.

The input unit, for example, is composed of a keyboard, a mouse, and the like. The display unit, for example, is composed of an LCD and the like and configures arithmetic operation processing results of the CPU and stored details of various databases stored in the memory to be displayable.

Figure 3:
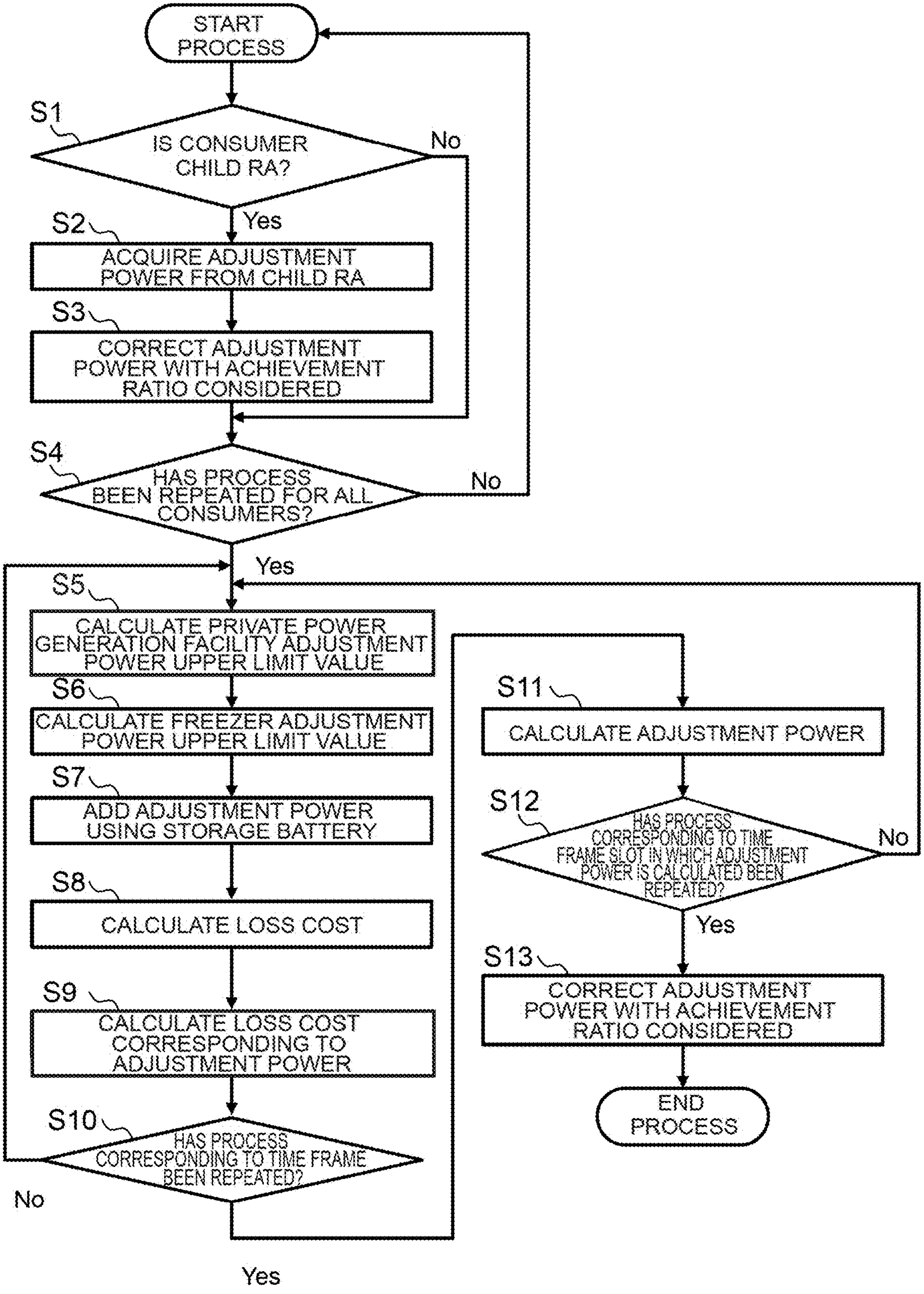
FIG. 3 is an adjustment power calculating flowchart of an aggregator system according to an embodiment of the present invention.

FIG. 3 is an adjustment power calculating flowchart of an aggregator system according to an embodiment of the present invention which is executed by the CPU illustrated in FIG. 2 in the RA2. In the following descriptions of FIGS. 4 to 8, the descriptions will be presented using the flowchart illustrated in FIG. 3.

Conventionally, it is complicated to predict and control behaviors of facilities of consumers such as a power generator, a freezer, and the like, and, basically, a concept in which a request of a DR instruction from a TSO may be responded on the basis of adjustment information transmitted up from an EMS or a child RA has been employed for the operation. In addition, types of facilities held for each consumer is different, and an operation cost thereof is also different for each facility. For this reason, there is concern that an instruction may not be obeyed depending on situation of an electric power demand at the time when the RA receives a notification of a DR instruction from an AC of a higher rank, and a penalty is generated in the AC. However, in the present invention, by performing the process represented in the flowchart of FIG. 3 using the RA2, adjustment power of each facility under management is estimated, and a control instruction is given to each facility 5 in accordance with the estimation result thereof. In other words, in the aggregator system according to this embodiment, by automatically distributing a demand/supply adjustment amount requested in a DR instruction in accordance with adjustment power of each facility 5 using a prediction control function of the RA2, reception power or supplied power of each facility 5 (hereinafter, these will be collected referred to as "received power") can be adjusted, and a necessary demand/supply adjustment amount can be provided at a low cost. The following flowchart will be described on the basis of these.

The flowchart of FIG. 3 is a plan draft flow for exhibiting adjustment power with a contract delivery unit price between RA2 and AC1, a contract delivery unit price between the RA2 and a consumer under the RA2, and a negative cost according to demand adjustment according to its own power generation facility 5 of a consumer taken into account. While the following description of the flow will be presented for the case of the parent-child type RA2 illustrated in FIG. 1(*b*) as an example, a similar process can be performed also in the case of the RA2 illustrated in FIG. 1(*a*).

First, the parent RA2*a* selects one of a plurality of consumers holding a facility 5 that is a target for resource control and determines whether or not the facility 5 of this consumer is under management of the child RA2*b* (Step S1). As a result, when it is checked that the facility is under management of the child RA2*b* (Step S1: Yes), adjustment power of each facility 5 is acquired from the child RA2*b* (Step S2). By using the adjustment power of each facility 5 received from the child RA2*b* in this way, the adjustment power of the child RA2*b* is replied to the AC1 of the higher rank. At this time, in a case in which the child RA2*b* cannot exhibit adjustment power as predicted, a penalty according to DR non-attainment is formed, and thus, by using an attainment rate that is arbitrarily set, the adjustment power of the child Ra2*b* is corrected (adjustment power before correction×attainment rate=adjustment power after correction) (Step S3). On the other hand, in a case in which the facility 5 of this consumer is not under management of the child RA2*b*, in other words, in the case of a facility 5 that is directly managed by the parent RA2*a* (Step S1: No), the processes of Steps S2 and S3 are not performed. By repeated performing this for contracted consumers (Step S4), for a facility 5 of a consumer that can be directly managed, processes of Steps S5 to S13 are further performed.

Figure 4:
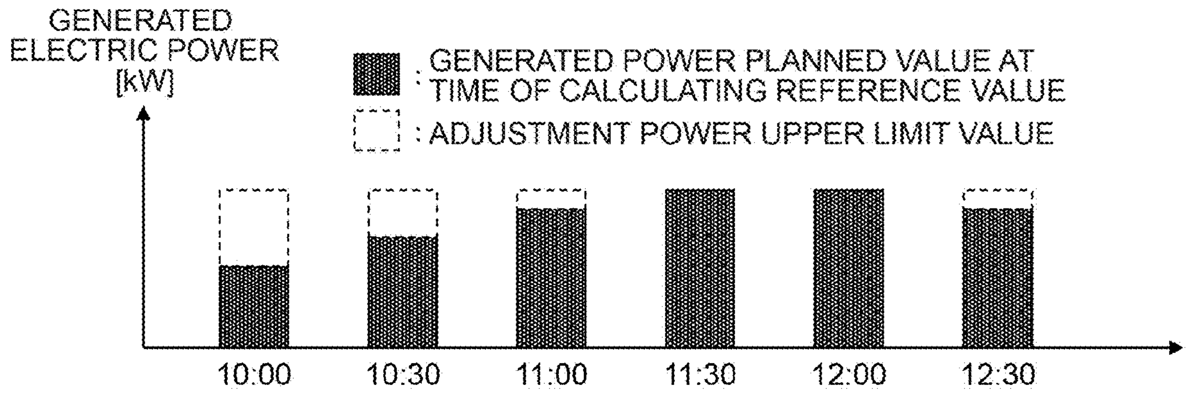
FIG. 4 is a graph for calculation of an upper limit value of private power generation facility adjustment power.

First, in a case in which a consumer has a private power generation facility as the facility 5, an upper limit value of adjustment power of the private power generation facility is calculated (Step S5). Hereinafter, a specific example of process details of Step S5 will be described with reference to FIG. 4. FIG. 4 is a graph for upper limit value calculation of private power generation facility adjustment power.

An upper limit value of adjustment power of the private power generation facility is calculated using the following Equation (1) or Equation (2). Equation (1) is a calculation equation of a case in which the private power generation facility is a power generator that can output constant generated electric power regardless of a surrounding environment, for example, an engine-type power generator, a gas turbine power generator, or the like, and Equation (2) is a calculation equation of a case in which a facility other than a private power generation facility has a solar photovoltaic power generator. In addition, rated generated electric power is electric power that can be stably output by the power generator. A power generation planned value is a power generation planned value based on power generation results. A power demand predicted value is a predicted value of an electric power demand of a consumer perceived by the RA2. A solar photovoltaic power generation prediction is a prediction of generated electric power according to solar photovoltaic power generation among private power generation facilities. A minimum received electric power is a minimal electric power among electric powers received from TSO.

$$\text{Upper limit value of private power generation facility adjustment power} = \text{rated generated electric power} - \text{generated electric power planned value} \quad \text{Equation (1)}$$

$$\text{Upper limit value of private power generation facility adjustment power} = \text{electric power demand predicted value} - \text{solar photovoltaic power generation prediction} - \text{minimum received electric power} \quad \text{Equation (2)}$$

For example, in the case of Equation (1), as illustrated in FIG. 4, a power generation planned value is different for each time frame, and a value exhibiting a maximum generated electric power (rated generated electric power) is the same in any time frame. For this reason, an upper limit value of adjustment power is different for each time frame. In this way, the upper limit value of adjustment power of a private power generation facility calculated in Step S5 is different in accordance with an operation plan of the private power generation facility at the time of a notification of a DR instruction.

As described above, in a case in which a consumer has a private power generation facility as the facility 5, adjustment power acquired by increasing or decreasing the supplied electric power is added. In accordance with this, adjustment power of the private power generation facility can be exhibited.

Figure 5:
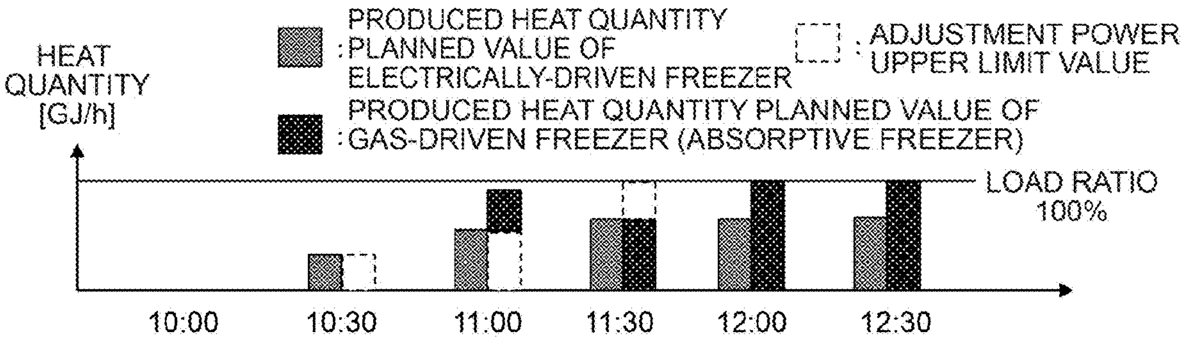
FIG. 5 is a graph relating to calculation of an upper limit value of a freezer adjustment power.

Subsequently, in a case in which a freezer is included in the facility 5 of a consumer, an adjustment power upper limit value of the freezer is calculated (Step S6). For example, in a case in which an electrically-driven freezer (a turbo freezer or the like) is not being operated when a notification of a DR instruction is received, the power consumption of the electrically-driven freezer is 0 and cannot be further decreased, and thus adjustment power cannot be exhibited. In addition, for example, in a case in which an absorptive freezer in place of the electrically-driven freezer is being operated at a rated operation, the absorptive freezer cannot produce an amount of heat larger than that. Thus, in order to produce a necessary amount of heat, the electrically-driven freezer needs to be continuously operated with a current operating load, and thus, similarly, adjustment power cannot be exhibited. Thus, similar to a case of a consumer having a private power generation facility, in accordance with an operating plan at the time of the notification of a DR instruction, an adjustment power upper limit value of the freezer is different. For example, as illustrated in FIG. 5, the produced heat amount planned value of the electrically-driven freezer is different for each time frame. In addition, there is also a difference in a production heat amount planned value of a gas freezer (absorptive freezer). Furthermore, the turbo freezer includes a turbo freezer of an inverter type and a turbo freezer of a constant-speed type. In addition, the absorption-type freezer includes a gas-driven freezer and a steam-driven freezer.

The calculation of this case is as represented in the following equations, Equation (3) is used when a rated freezer capacity of a gas-driven freezer—a production heat amount planned value of the gas-driven freezer≥a production heat amount of an electrically-driven freezer, and Equation (4) is used when a rated freezer capacity of a gas-driven freezer—a production heat amount planned value of the gas-driven freezer<a production heat amount of an electrically-driven freezer. In addition, in Equations (3) and (4), in the power consumption of the electrically-driven freezer and the gas-driven freezer, electric power for driving auxiliary power of a pump or the like is included.

$$\text{Freezer adjustment power upper limit value} = \text{power consumption at production heat amount planned value of electrically-driven freezer} - \text{power consumption increase accompanying production heat amount increase of gas-driven freezer} \quad \text{Equation (3)}$$

$$\text{Freezer adjustment power upper limit value} = \text{power consumption decrease accompanying production heat amount decrease of electrically-power consumption increase accompanying production heat amount increase of gas-driven freezer} \quad \text{Equation (4)}$$

In this way, it can be understood that, in an amount of heat acquired through addition of an electrically-driven freezer and a gas-driven freezer, when a result of the addition is within a load rate of 100%, the adjustment power upper limit value of the freezer corresponds to power consumption of the electrically-driven freezer.

As described above, in a case in which a consumer has an electrically-driven freezer and an absorptive-type freezer as facilities 5, by decreasing production cold heat according to the electrically-driven freezer while increasing production cold heat according to the absorptive-type freezer, adjustment can be performed such that the received electric power is decreased by exhibiting adjustment power according to the freezer. In accordance with the RA, which manages a plurality of bases, maintaining information of result values and facility schedule adjustment power upper limits for main devices such as individual freezers and the like, more detailed adjustment power can be exhibited.

Subsequently, adjustment power acquired by using electric power charged in an accumulation battery instead is added (Step S7). In accordance with this, in a case in which a consumer has a storage battery as a facility 5, adjustment power acquired by increasing the supplied electric power thereof is added. In accordance with this, the adjustment power of the storage battery can be exhibited.

As described above, when adjustment power that is an adjustable amount of received power according to each facility 5 can be predicted for various facilities 5 held by a consumer, next, a loss cost is calculated (Step S8). The loss cost represents a unit price of power generation according to a private power generation facility required for complementing a difference between a demand/supply plan of electric power and received power after adjustment according to a DR instruction and is different in accordance with a configuration of the private power generation facility and a type of power generator to be operated. There are cases in which energy costs of a cogeneration system and various freezers increase at the time of delivering adjustment power, and an additional cost thereof is changed in accordance with a facility load rate and an electric-heat demand balance before adjustment power delivery. For this reason, it is necessary to automatically calculate an additional cost accompanying adjustment power delivery using performance characteristics of each facility and draft an operating plan with priority levels of facility operating and profitability according to adjustment power delivery based on the additional cost taken into account. The calculation of the loss cost of each facility will be described with reference to FIGS. 6 and 7. In addition, the storage battery includes a NAS battery, a lithium-ion battery, a lead storage battery, and the like.

Figure 6:
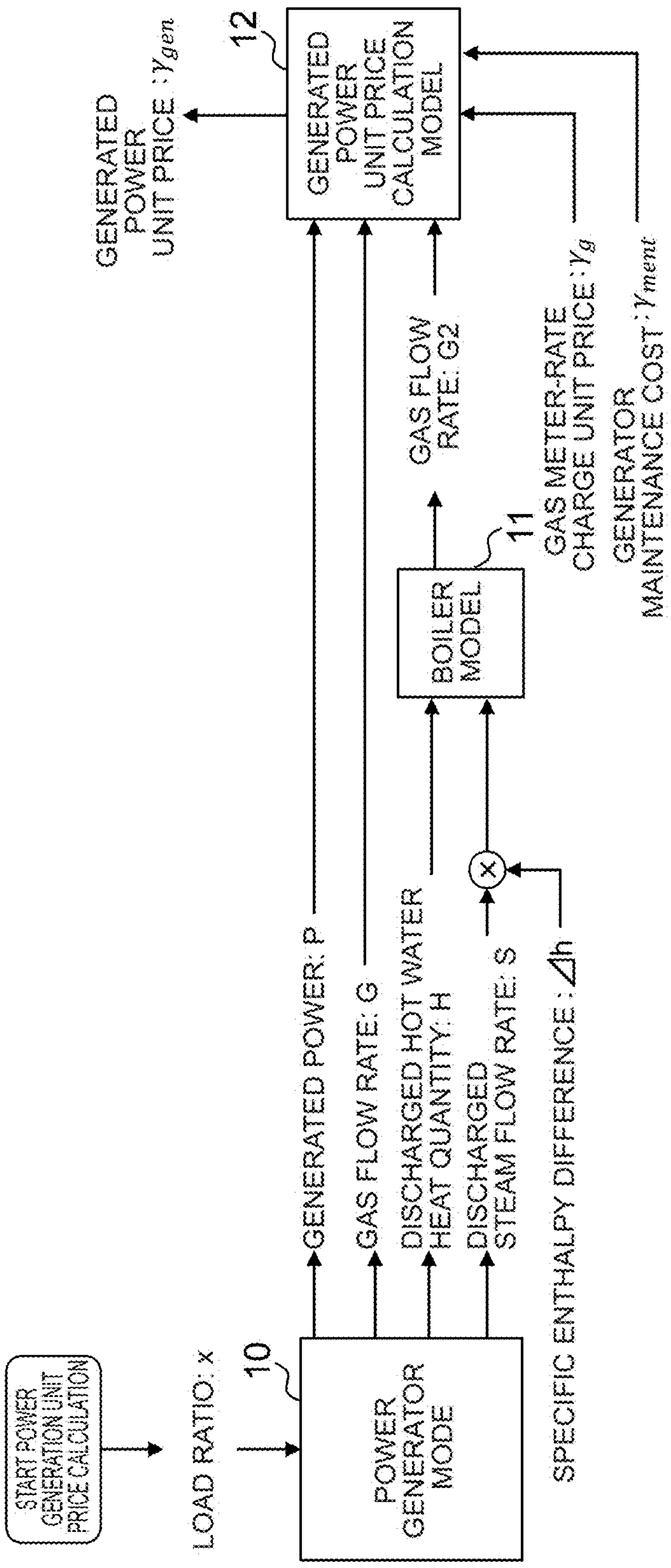
FIG. 6 is a first power generation unit calculation pattern relating to calculation of a loss cost of a private power generation facility.

FIG. 6 illustrates a method of calculating a loss cost of a private power generation facility in a case in which heat collection of power generator-discharged heat can be performed. In other words, the method is a loss cost calculating method that can be applied in a case in which a heat demand is equal to or larger than discharged heat of a co-generation system (CGS) (heat demand≥CGS discharged heat). In addition, an equation for acquiring a heat demand is the following Equation (5). In Equation (5), H_dem represents a hot water demand, S_dem represents a discharged steam demand, and Δh represents a specific enthalpy difference. In addition, the CGS includes a gas engine, a fuel cell, a gas turbine, and the like.

$$\text{Heat demand} = \Sigma(\text{H\_dem} + \text{S\_dem} \cdot \Delta h \qquad \text{Equation (5)}$$

In power generation unit price calculation of a private power generation facility that can perform heat collection of power generator discharged heat illustrated in FIG. 6, first, a load rate X of an operating plan before a DR instruction is input to a power generator model 10. In accordance with this, generated electric power P, a gas flow rate G, a discharged hot water heat amount H, and a discharged steam heat amount S are output from the power generator model 10. The discharged hot water heat amount H and the discharged steam heat amount S are input to a boiler model 11 (the discharged steam heat amount S by which the specific enthalpy difference Δh is multiplied is input), and, in accordance with this, a gas flow rate G2 of the boiler is output. By inputting a generated electric power P, a gas flow rate G (including an output from the boiler model), a gas meter rate unit price γg, and a power generator maintenance rate γment to a power generator unit price calculating model 12, a power generation unit price γgen is output. A loss cost is acquired by subtracting a power generation unit price at the time of a reception power plan from this power generation unit price γgen.

Figure 7:
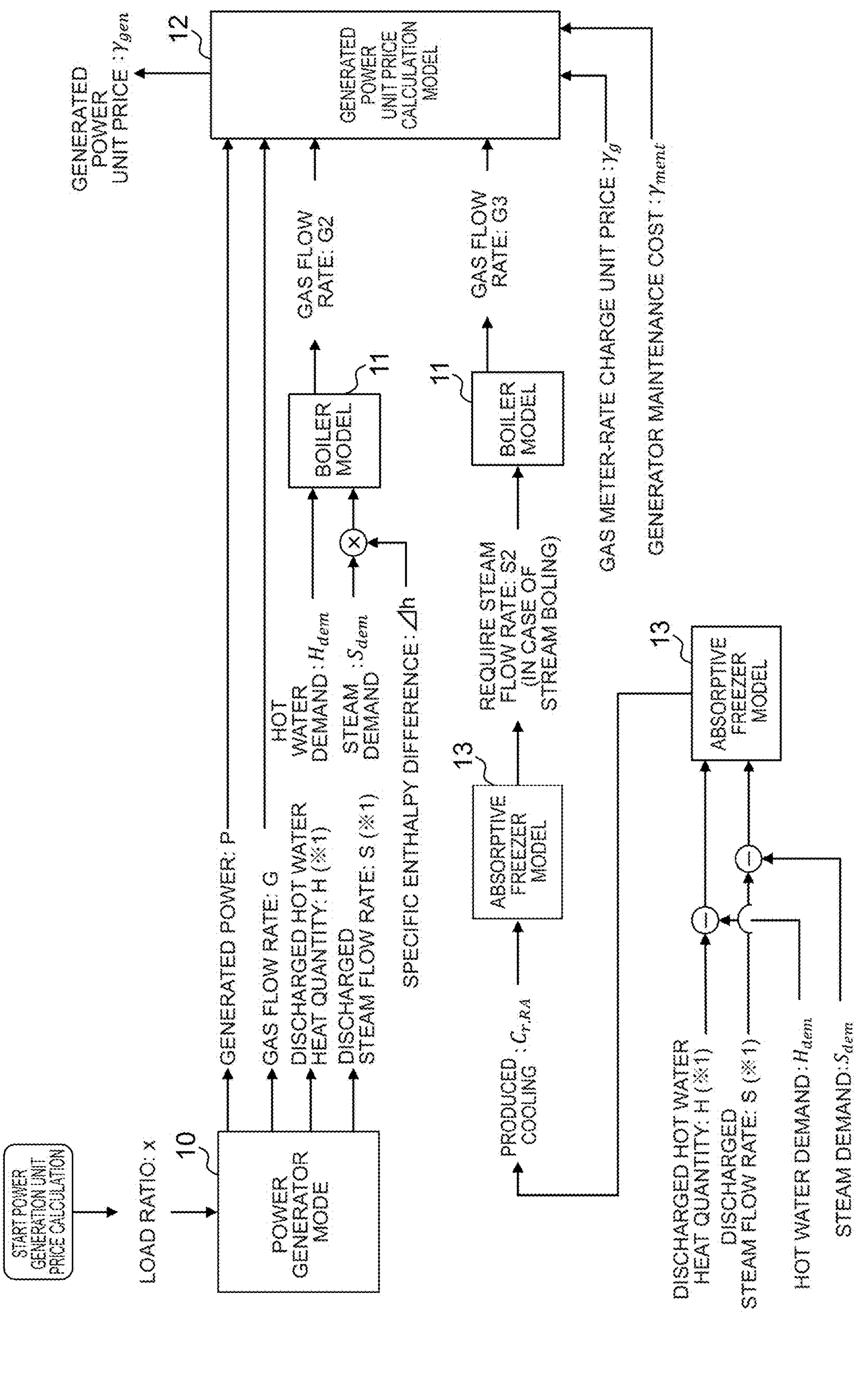
FIG. 7 is a second power generation unit calculation pattern relating to calculation of a loss cost of a private power generation facility.

FIG. 7 illustrates a loss cost calculating method of a case in which power generator discharged heat is excessive (heat demand <CGS discharged heat) and a case in which production cold heat using the CGS discharged heat≤cold water demand. In description of FIG. 7, parts that are duplicates of FIG. 6 will be omitted.

In FIG. 7, a value acquired by subtracting a discharged hot water heat amount H from a hot water demand Hdem and a value acquired by subtracting a discharged steam heat amount S from a discharged stream demand Sdem are input to an absorptive freezer model 13 (see (*1)). In accordance with this, produced cold heat Cr, RA is output. Furthermore, when this produced cold heat Cr, RA is input to the absorptive freezer model 13, a stream flow rate S2 (in the case of steam firing) that is necessary for acquiring a production heat amount planned value is output, and the necessary steam flow rate S2 is input to a boiler model 11. In addition to a gas flow rate G3 output from an input of the necessary stream flow rate S2, the hot water demand Hdem and the discharged stream demand Sdem (by which a specific enthalpy difference Δh is multiplied) are input to the boiler model 11, and a gas flow rate G2 is output therefrom. Equations of each model will be omitted.

In this way, by embedding characteristics of a device of each facility, a loss cost accompanying adjustment of received power can be calculated for each consumer. In addition, each of the models illustrated in FIGS. 6 and 7 is, for example, stored in a memory in the hardware configuration of the RA2 illustrated in FIG. 2. By using this model, the loss cost calculation of Step S9 can be performed. Alternatively, a model may be acquired from another computer through an input/output interface, or the loss cost calculation of Step S8 may be performed using a model stored in another computer.

In this way, for example, in the case of the CGS, by calculating a loss cost according to exhibition of adjustment power with a waste collection effect taken into account, a cost that additionally occurs in a case in which a DR instruction is responded can be visualized. Thus, comparison with an incentive acquired by responding to the DR instruction can be easily performed. In addition, in accordance with an RA, which manages a plurality of bases, maintaining model information of main devices such as these individual freezers and the like and information of loss costs thereof or information for the arithmetic operation, adjustment power calculation having higher accuracy can be performed.

When the loss cost is calculated in Step S8, by using the calculation result, a loss cost corresponding to the adjustment power is calculated (Step S9 of FIG. 3). Here, within the range of an adjustment power upper limit value for each facility calculated in each of Steps S5 to S7, a relation of the adjustment power of each facility and a loss cost according thereto is acquired.

When it is checked that Steps S5 to S9 have been repeated in correspondence with a time frame (according to a planned value same-time and same-amount system for every 30 minutes) (Step S10), adjustment power of each time frame is calculated for each consumer (Step S11).

Figure 8:
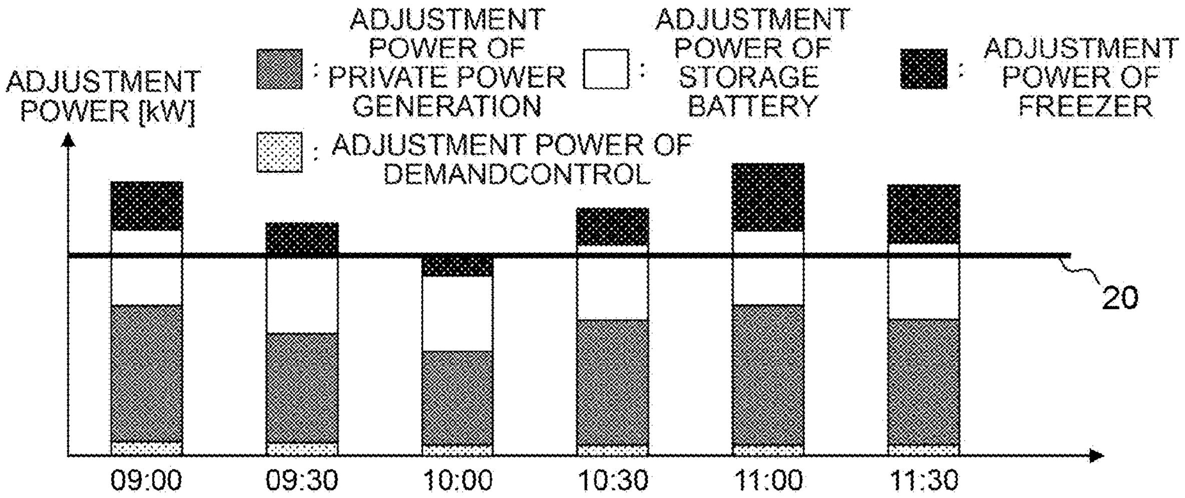
FIG. 8 is a graph of an adjustable amount for each time frame.

Hereinafter, a method of calculating adjustment power of each time frame in Step S11 will be described with reference to FIG. 8. FIG. 8 is a graph of an adjustable amount for each time frame.

As illustrated in FIG. 8, although a maximum value of adjustment power acquired by summing adjustment power of private power generation, adjustment power of a storage battery, adjustment power of a freezer, and adjustment power of demand control is different for each time frame, when received power is adjusted in accordance with a DR instruction, each consumer needs to continuously exhibit adjustment power of the same value for a specified time frame. Thus, an adjustment power upper limit value of each facility calculated in Steps S5 to S7 is collected for each consumer, and adjustment power for each consumer in each time frame is calculated. In the case of FIG. 8, a line 20 at which adjustment power can be continuously maintained is a maximum value of a frame of 10:00 in which the adjustable amount is a minimum, and adjustment power of all the time frames are adjusted in accordance with this line 20.

After adjustment power for each consumer is calculated in Step S11 illustrated in FIG. 3, it is determined whether or not the processes of Steps S5 to S11 have been repeated in correspondence with time frame slots in which adjustment power is calculated (Step S12). As a result, in a case in which a time frame slot in which the processes of Steps S5 to S11 have not been performed is present (Step S12: No), the process returns to Step S5, and the process continues. When it is checked that the processes of Steps S5 to S11 have been performed for all the time frame slots (Step S12: Yes), similarly to Step S3, correction with an attainment rate taken into account is performed for adjustment power for each consumer calculated in Step S11 (Step S13). When Step S13 is performed, the flow of calculation of the adjustment power (a lowering DR for suppressing a demand) illustrated in FIG. 3 ends.

Thereafter, when a notification of a DR instruction is received from an AC1, on the basis of the adjustment power of each time frame calculated for each consumer in the processing flow illustrated in FIG. 3, the parent RA2*a* determines an operating plan of each facility held by each consumer and outputs a control instruction corresponding to the operating plan to each facility. Details of the process details at this time will be described below with reference to FIG. 11.

Next, ratio distribution of received power adjustment amounts of respective facilities 5 that is performed in the child RA2*b* will be described. As described above, the parent RA2*a* that has received a notification of a DR instruction from the AC1 does not perform adjustment of received power according to the control instruction for each facility 5 under management of the child RA2*b*, that is, each facility 5 other than adjustment targets of received power according to the parent RA2*a*, and directly outputs the DR instruction notified from the AC1 to the child RA2*b* managing this facility 5. The child RA2*b* that has received this DR instruction performs ratio distribution of adjustment amounts of received power for each consumer. The ratio distribution is to distribute adjustment amounts of received power instructed using the DR instruction at a ratio corresponding to a ratio of adjustment power of each consumer predicted in advance for a plurality of consumers holding this facility 5. In accordance with this, the child RA2*b* performs an adjustment instruction for received power for each facility 5 thereunder. Hereinafter, an example of the ratio distribution performed by the child RA2*b* will be described with reference to FIG. 9.

Figure 9:
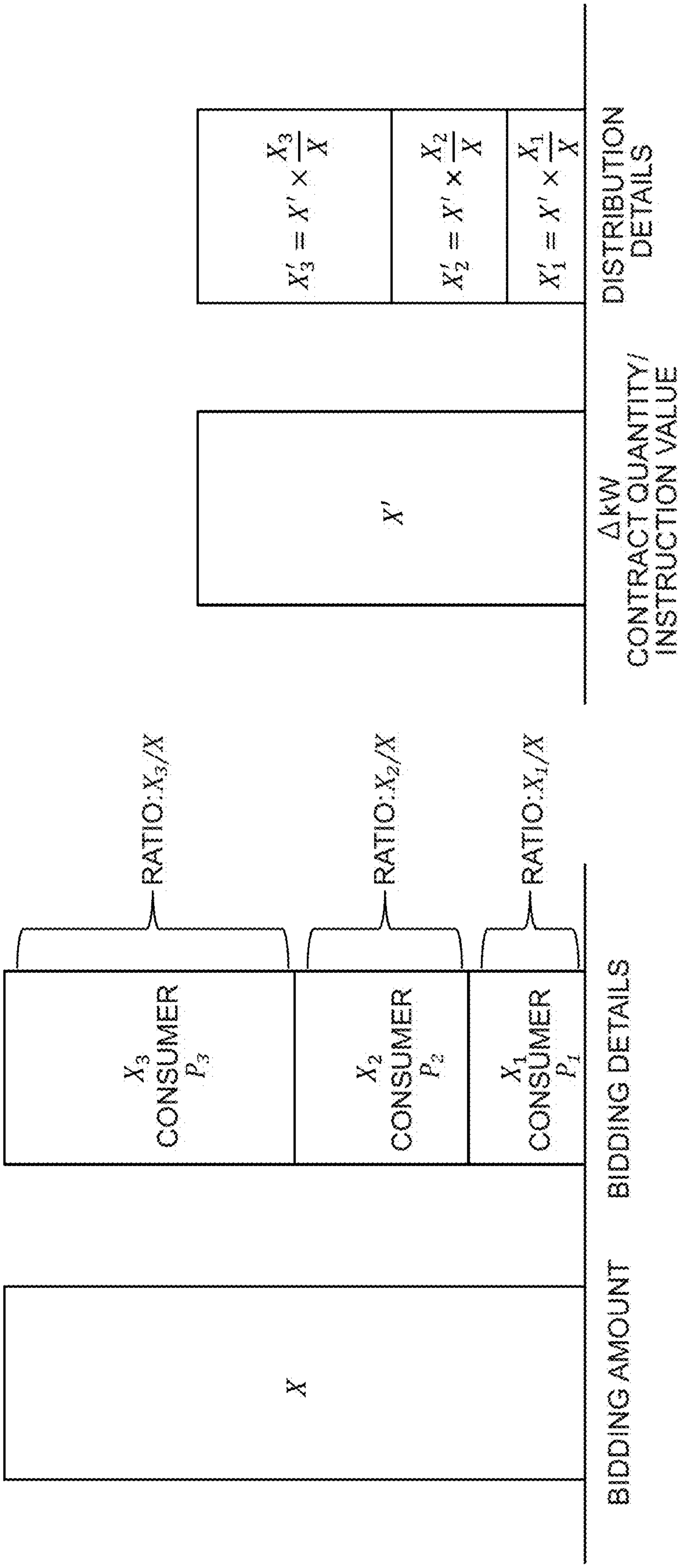
FIG. 9 is an overview of ratio distribution for each consumer.

FIG. 9 is a diagram illustrating an overview of ratio distribution for each consumer. In addition, the flow of FIG. 3 is a flow of calculation of adjustment power, and thus ratio distribution for each consumer is omitted.

In the ratio distribution, while a ratio of adjustment power at the time of bidding of each consumer that is predicted in advance is maintained, an adjustment amount of received power instructed in accordance with a DR instruction is distributed to each consumer. In FIG. 9, for respective consumers P1, P2, and P3 managed by the child RA2*b*, predicted adjustment powers X1, X2, and X3 of the consumers at the time of bidding, delivered adjustment powers X'1, X'2, and X' 3 of the consumers, a bid amount X, and a contract amount (an instruction value of an adjustment amount of received power according to the DR instruction) X' are illustrated. Each unit thereof is kw. A ratio of predicted adjustment power of each consumer for the bidding amount X is calculated using the following equation.

$$\text{Ratio of each consumer} = Xi/X(I = 1, 2, 3) \qquad \text{Equation (6)}$$

When the child RA2*b* receives a notification of a DR instruction through the parent RA2*a*, by multiplying a contract amount (instruction value) X' instructed in the DR instruction by a ratio of each consumer calculated in Equation (6) (see distribution details), adjustment power to be delivered by each consumer, that is, X'i (i=1, 2, 3) that is an adjustment amount of received power with which each consumer is instructed is calculated. In addition, such ratio distribution can be applied not only to the child RA2*b* but also the parent RA2*a* or RA2 that directly manages facilities of consumers.

Next, a transmission schedule of a control instruction from the RA2 to each facility 5 will be described. When a notification of a DR instruction is received from the AC1, by performing a process to be described below, the RA2 determines an adjustment amount of received power instructed for each facility and outputs a control instruction corresponding to the adjustment amount to each facility. At this time, in consideration of an operating time of each facility, an output timing of the control instruction is determined. Hereinafter, an example of the output timing of a control instruction will be described with reference to FIG. 10.

Figure 10:
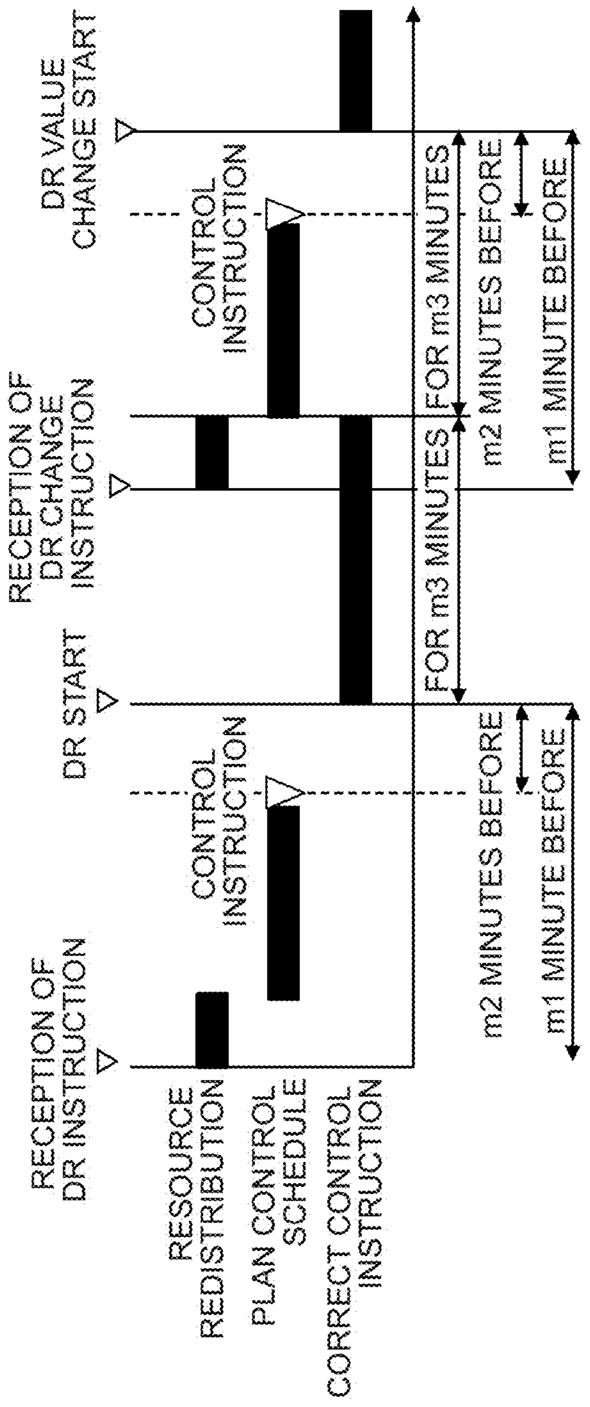
FIG. 10 is an example of a control instruction transmission schedule.

FIG. 10 is an example of a transmission schedule of a control instruction from a RA2 to each facility 5.

First, after a DR instruction is received from a higher-rank AC1, on the basis of adjustment power for each time frame slot of each consumer determined in the process illustrated in the flowchart of FIG. 3 described above, the RA2 performs resource re-distribution process and drafting of a control schedule for the DR instruction. In accordance with this, details of the control instruction for each facility 5 are determined. Next, on the basis of an operating time and the like of each facility 5, a time m2 [minutes] required until adjustment of received power starts after each facility 5 receives a control instruction is estimated, and when it becomes m2 [minutes] before a DR start timing (an adjustment start timing of received power instructed using the DR instruction), a control instruction is output to each facility 5. The RA2 can determine the output timing of a control instruction in this way. Next, after the DR starts, demand included in each facility 5 is monitored, and, in a case in which a deviation between a value of an adjustment amount of received power instructed using the DR instruction and a result value is detected, correction of the control instruction is performed as necessary. In this way, the RA2 has a function for outputting a control instruction to each facility 5 of the consumer and can output an instruction including an operating timing and can be directly involved in operating control.

In addition, in FIG. 10, m1 represents a time until a DR start timing after reception of a DR instruction, and m3 represents a collection period of a received power amount used for correction of the control instruction. Here, m1, m2, and m3 are different in accordance with handling adjustment power and thus can be arbitrarily changed.

Figure 11:
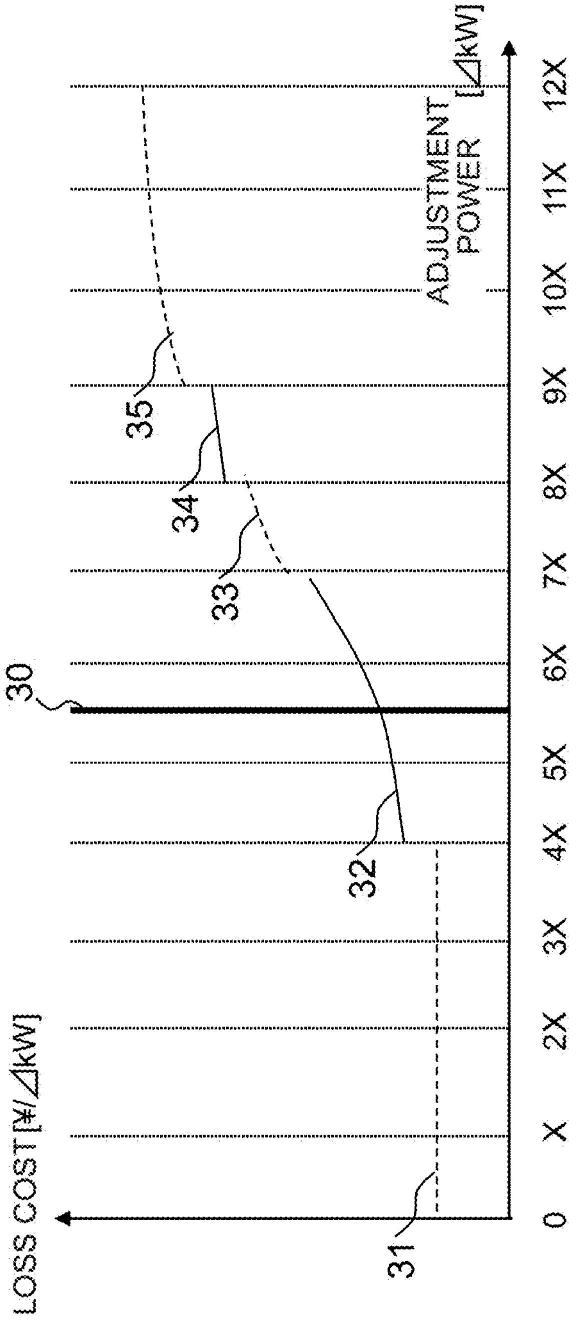
FIG. 11 is a graph representing a relation between an adjustment power and a loss cost.

Next, a method of determining an operating plan of the facility 5 will be described with reference to FIG. 11. By performing the process of Step S10 described above in the process flow of FIG. 3, the RA2 can acquire a relation between adjustment power and a loss cost of each time frame for each consumer. FIG. 11 illustrates an example of a graph representing a relation between adjustment power and a loss cost in a certain time frame. In FIG. 11, the horizontal axis represents a magnitude of adjustment power, and the vertical axis represents a loss cost. In addition, in the graph illustrated in FIG. 11, values of adjustment power of the horizontal axis are separated for every X [kW], and a relation between adjustment power and a loss cost in the range of 0 to 12× is illustrated.

By using a transition graph of a loss cost with respect to adjustment power generated for each time frame, the RA2 determines an operating plan of each facility 5 for each consumer and outputs a control instruction to each facility 5 on the basis of the operating plan. For example, in a case in which a lowering DR instruction (an instruction for a consumer to suppress use of electric power) instructing an adjustment amount 30 of received power corresponding between adjustment power 5X to 6X for a time frame in which the relation between the adjustment power and the loss cost as illustrated in FIG. 11 is acquired is notified, the RA2 that has received this notification determines to respond to the lowering DR instruction using discharge of a storage battery and a power generation output increase of private power generation. More specifically, for example, it is assumed that loss costs of the storage battery and the private power generation are values represented using reference numbers 31 and 32 (a storage loss cost 31 and a private power generation loss cost 32), and an upper limit value of the discharge amount of the storage battery is 4× [kW]. In this case, it can be understood from the graph illustrated in FIG. 10 that the adjustment amount 30 can be responded by using discharge of the storage battery and the private power generation in combination. For this reason, by determining an operating plan such that the storage battery and the private power generation facility are operated and outputting a control instruction to each of such facilities, the RA2 supplements the adjustment amount 30 of the received power instructed using the lowering DR instruction. In accordance with this, the consumer can realize adjustment of the received power of each facility corresponding to the lowering DR instruction.

In a case in which a lowering DR instruction instructing an adjustment amount of received power that is further larger than the adjustment amount 30 is notified, the RA2 determines a facility 5 to be operated by outputting a control instruction in order of the lowest to highest cost represented in the graph illustrated in FIG. 11. In FIG. 11, since the loss cost rises in order of an absorptive freezer loss cost 33→private power generation loss cost 34→absorptive freezer loss cost 35, in accordance with this order, a facility 5 to which a control instruction is output can be determined.

By using the processes as described above, for an adjustment amount of received power instructed using a lowering DR instruction value, the RA2 can determine an operating plane of each facility on the basis of adjustment power and a loss cost of each facility and draft a control schedule of each facility. For example, as described above, in a case in which a consumer 5 has an electrically-driven freezer and an absorptive-type freezer as facilities, as illustrated in FIG. 5, a control schedule in which produced cold heat according to the absorptive-type freezer is increased, and produced cold heat according to the electrically-driven freezer is decreased is drafted, and a control instruction is output. In accordance with this, adjustment power according to the freezer is exhibited in accordance with a DR instruction, and received electric power of all the consumers can be adjusted.

In this way, when a control schedule of each facility can be drafted, the RA2 outputs a control instruction value to each facility m2 [minutes] before a control instruction time with a control schedule thereof and an operating time of each facility being taken into account (see FIG. 9). In addition, it is assumed that the setting of an advanced instruction time m2 can be changed for each facility.

Figure 12:
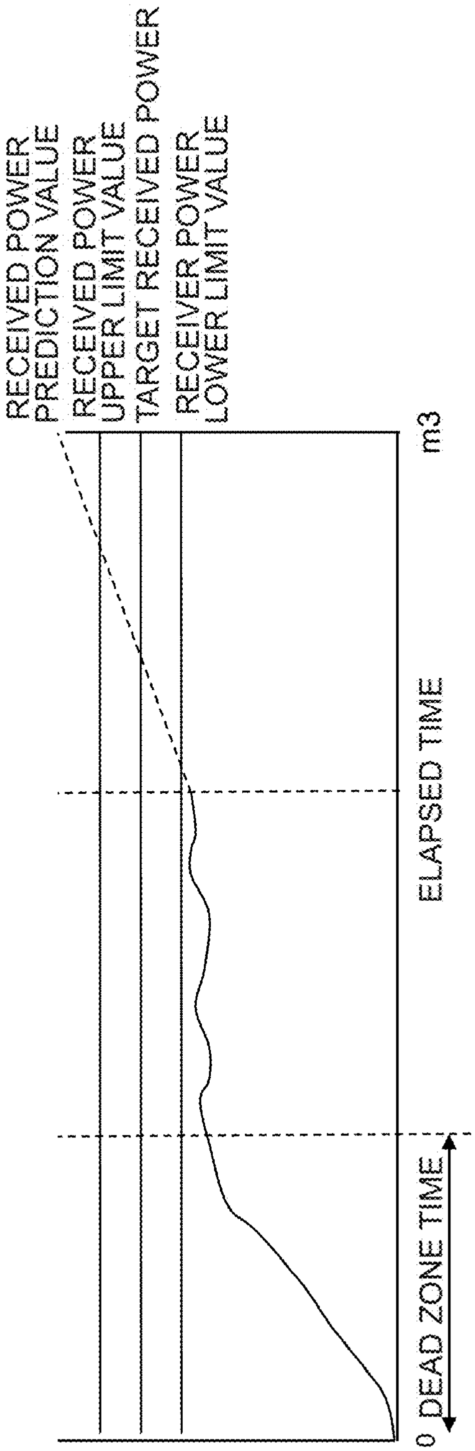
FIG. 12 is a graph for describing a control instruction correction.

Next, correction of a control instruction will be described. As described in FIG. 10 described above, in a case in which a result value deviates from the adjustment amount of received power instructed using a DR instruction, the RA2 performs correction of the control instruction as necessary. FIG. 12 is a graph describing a control instruction correction at this time.

Although the RA2 outputs a control instruction to each facility of the consumer in accordance with the drafted control schedule, in a case in which there is a possibility of an occurrence of a deviation of a result value from received electric power after adjustment planned for all the consumers, correction of control instruction values is performed. For example, the RA2 collects received electric power amount [kWh] in a collection period of m3 [minutes] (see FIG. 10) with a period of one minute and calculates a received electric power predicted value [kW] in accordance with the following Equation (7). In Equation (7), n is an integer as n=0, 1, 2, 3, . . . . In the case of m3=30, a regular time and a regular time+30 minutes are set as start times.

$$\text{Received electric power predicted value} = \text{received electric power amount after regular time} + m3 \times n\,[\text{minutes}]\text{ until the current time/elapsed time }[\text{min}] \times 60\,[\text{min/h}]) \quad \text{Equation (7)}$$

In a case in which the received electric power predicted value calculated in Equation (7) deviates from the received electric power upper limit value or lower limit value respectively acquired in the following Equations (8) and (9), the RA2 performs correction of the control instruction value. Here, a dead zone time m4 is set other than a target for control instruction value correction. Here, a time until a changed instruction is applied after reception of a DR change notification, both instruction values before and after change are provided.

$$\text{Received electric power lower limit value} = \text{reference value} - (DR\text{ instruction value} + \Delta kW\text{ contract amount of this frame} \times \alpha) \quad \text{Equation (8)}$$

$$\text{Received electric power upper limit value} = \text{reference value} - (DR\text{ instruction value} - \Delta kW\text{ contract amount of this frame} \times \alpha) \quad \text{Equation (9)}$$

A method of acquiring received electric power upper/lower limit values until start of application of changed value after reception of a DR instruction change notification will be illustrated below. In addition, in the case of DR instruction value after change>DR instruction value before change, an upper limit value and a lower limit value of the received electric power are respectively acquired using Equations (10) and (11), and in the case of DR instruction value after change<DR instruction value before change, an upper limit value and a lower limit value of the received electric power are respectively acquired using Equations (12) and (13). Furthermore, an initial setting value α=0.1 and can be changed in accordance with an internal setting value.

$$\text{Received electric power lower limit value} = \text{reference value} - (DR\text{ instruction value after change} + \Delta kW\text{ contract amount of this frame} \times \alpha) \quad \text{Equation (10)}$$

-continued $$\text{Received electric power upper limit value} = \text{reference value} - (DR \text{ instruction value before change} - \Delta kW \text{ contract amount of this frame} \times \alpha) \quad \text{Equation (11)}$$

$$\text{Received electric power lower limit value} = \text{reference value} - (DR \text{ instruction value before change} + \Delta kW \text{ contract amount of this frame} \times \alpha) \quad \text{Equation (12)}$$

$$\text{Received electric power upper limit value} = \text{reference value} - (DR \text{ instruction value after change} - \Delta kW \text{ contract amount of this frame} \times \alpha) \quad \text{Equation (13)}$$

In this way, a system that can perform automatic distribution of adjustment power for each factory or each building facility and automatically correct a control instruction value such that it becomes target received electric power by detecting a deviation between an estimate and a result can be provided.

As above, in the present invention, adjustment power of each consumer can be collected, and a prediction operation can be performed, and thus, for example, a proposal indicating that this time frame has remaining power and thus is profitable can be performed, and calculation of loss costs of a CGS, a freezer, and the like and quantization of facility characteristics of a CGS, a freezer, and the like can be performed. In addition, a direct adjustment amount can be predicted and controlled with control parameters of each facility taken into account as well.

According to a first embodiment of the present invention described above, the following operations and effects can be acquired.

(1) An aggregator system outputting a control instruction relating to electric power to a consumer consuming electric power, in accordance with a variation of a power generation amount of a power supply company, the aggregator system predicting adjustment power that is an adjustable amount of received power according to each of facilities 5 of the consumer and outputting a control instruction for adjusting received power to each of the facilities 5 on the basis of the predicted adjustment power of each of the facilities 5 and a DR instruction that is a demand/supply adjustment instruction for the electric power from the power supply company. By configuring as such, an aggregator system of which responsiveness for a DR request is improved can be provided.

(2) The aggregator system collects the adjustment power of each of the facilities 5 that each of a plurality of consumers has and manages the facilities 5 of each of the consumers. By configuring as such, adjustment power of each facility 5 is estimated, and a control instruction for each facility 5 can be performed in accordance with an estimation result thereof.

(3) The aggregator system: calculates a loss cost accompanying adjustment of the received power by using operating models 10 to 13 of the facilities 5, determines an operating plan of each of the facilities 5 on the basis of the adjustment power and the loss cost, and outputs the control instruction on the basis of the determined operating plan. By configuring as such, after an additional cost that incurs in a case in which a DR instruction is responded, adjustment power of the system can be exhibited.

(4) The facilities 5 of the aggregator system include at least one of a CGS and a freezer. By configuring as such, by embedding characteristics of a device of each facility, a loss cost accompanying adjustment of received electric power is calculated for each consumer.

(5) The aggregator system determines an output timing of the control instruction on the basis of an adjustment start timing of the received power instructed using the DR instruction and an operating time of the facility 5. By configuring as such, an output timing of a control instruction can be determined by the RA2.

(6) In the aggregator system, the freezer includes an electrical driving-type freezer and an absorptive-type freezer, and the control instruction is output such that produced cold heat based on the absorptive-type freezer is increased, and produced cold heat based on the electrical driving-type freezer is decreased. By configuring as such, adjustment power according to a freezer is exhibited, and received electric power of a consumer can be adjusted in accordance with a DR instruction.

(7) In the aggregator system, the facilities 5 include a non-target facility, which is not a target of adjustment of the received power according to the control instruction, and the aggregator system performs an adjustment instruction for the received power for the non-target facility by distributing an adjustment amount of the received power instructed using the DR instruction to a plurality of consumers having the non-target facility at a ratio corresponding to a ratio of adjustment power of each consumer predicted in advance. By configuring as such, for each facility 5 that cannot be directly managed, a DR instruction is directly notified to a child RA2*b* managing each facility 5, and a response for requesting to take a role of DR distribution can be performed.

(8) In the aggregator system, a first consumer 2*a*, for which the aggregator system manages adjustment power in units of facilities 5, and a second consumer 2*b*, for which the aggregator system manages adjustment power in units of consumers, or a child aggregator system managing adjustment power in units of a plurality of consumers are present, and adjustment power of the first consumer 2*a*, and of the second consumer 2*b* or the child aggregator system, are collected and managed. By configuring as such, various power demand/supply adjustment patterns for a consumer can be responded.

In addition, the present invention is not limited to the embodiment described above, and various modifications and a combination with another configuration can be performed within a range not departing from the concept thereof. Furthermore, the present invention is not limited to include all the components described in the embodiment described above and includes an embodiment in which some of the components are eliminated.

REFERENCE SIGNS LIST

1 Aggregation coordinator (AC)
2 Resource aggregator (RA)
2*a* Parent RA
2*b* Child RA (tenant)
3*a* Base A
3*b* Base B
4 Energy center
5 Facility
10 Power generator model
11 Boiler model
12 Power generation unit price calculating model
13 Absorptive freezer model

20 Line at which adjustment power can be continuously maintained
30 Lowering DR instruction value
31 Storage battery loss cost
32 Private power generation loss cost
33 Absorptive freezer loss cost
34 Private power generation loss cost
35 Absorptive freezer loss cost

The invention claimed is:

1. An aggregator system outputting a control instruction relating to electric power to a consumer consuming electric power, in accordance with a variation of a power generation amount of a power supply company, the aggregator system predicting adjustment power that is an adjustable amount of received power according to each of facilities of the consumer and outputting a control instruction for adjusting received power to each of the facilities on the basis of the predicted adjustment power of each of the facilities and a DR instruction that is a demand/supply adjustment instruction for the electric power from the power supply company, wherein the facilities include a non-target facility, which is not a target of adjustment of the received power according to the control instruction, and the aggregator system performs an adjustment instruction for the received power for the non-target facility by distributing an adjustment amount of the received power instructed using the DR instruction to a plurality of consumers having the non-target facility at a ratio corresponding to a ratio of adjustment power of each consumer predicted in advance.

2. The aggregator system according to claim 1, which collects the adjustment power of each of the facilities that each of a plurality of consumers has and manages the facilities of each of the consumers.

3. The aggregator system according to claim 1, which calculates a loss cost accompanying adjustment of the received power by using an operating model of the facilities, determines an operating plan of each of the facilities on the basis of the adjustment power and the loss cost, and outputs the control instruction on the basis of the determined operating plan.

4. The aggregator system according to claim 1, wherein the facilities include at least one of a CGS and a freezer.

5. The aggregator system according to claim 4, wherein the freezer includes an electrical driving-type freezer and an absorptive-type freezer, and the control instruction is output such that produced cold heat based on the absorptive-type freezer is increased, and produced cold heat based on the electrical driving-type freezer is decreased.

6. The aggregator system according to claim 1, which determines an output timing of the control instruction on the basis of an adjustment start timing of the received power instructed using the DR instruction and an operating time of the facility.

7. The aggregator system according to claim 1, wherein a first consumer, for which the aggregator system manages adjustment power in units of facilities, and a second consumer, for which the aggregator system manages adjustment power in units of consumers, or a child aggregator system managing adjustment power in units of a plurality of consumers are present, and adjustment power of the first consumer, and of the second consumer or the child aggregator system, are collected and managed.

* * * * *